United States Patent [19]

Tomioka et al.

[11] Patent Number: 5,665,664
[45] Date of Patent: Sep. 9, 1997

[54] GRAIN BOUNDARY-FREE CRYSTALLINE BODY OF MANGANESE-BASED COMPOSITE OXIDE AND METHOD FOR THE PREPARATION THEREOF

[75] Inventors: Yasuhide Tomioka; Yoshinori Tokura, both of Ibaraki-ken, Japan

[73] Assignees: Japan as represented by Director General of Agency of Industrial Science and Technology; Angstrom Technology Partnership, both of Tokyo, Japan

[21] Appl. No.: 552,620

[22] Filed: Nov. 3, 1995

[30] Foreign Application Priority Data

Nov. 4, 1994 [JP] Japan .................. 6-271566

[51] Int. Cl.$^6$ .................. C04B 35/50; C30B 13/00
[52] U.S. Cl. .................. 501/152; 501/86; 117/49
[58] Field of Search .................. 501/152, 86; 117/49

[56] References Cited

U.S. PATENT DOCUMENTS

| | | | |
|---|---|---|---|
| 3,210,165 | 10/1965 | Van Run et al. | 117/49 |
| 4,045,375 | 8/1977 | Komatu | 501/152 |
| 4,357,426 | 11/1982 | Murata et al. | 501/135 |
| 4,562,124 | 12/1985 | Ruka | 501/152 |
| 5,367,981 | 11/1994 | Maruyama | 117/49 |
| 5,534,468 | 7/1996 | Stephenson | 501/12 |

OTHER PUBLICATIONS

T. Ishihara et al., "Doped PrMnO$_3$ Perovskite Oxide as a New Cathode of Solid Oxide Fuel Cells for Low Temperature Operation", *J. Electrochem. Soc.*, vol. 142, No. 5, May 1995, pp. 1519–1523.

Y. Tomioka et al., "Anomalous Magnetotransport Properties of Pr$_{1-x}$Ca$_x$MnO$_3$", *J. Phys. Soc. Jpn.*, vol. 64, No. 10 Oct. 1995, pp. 3626–3630.

Y. Tomioka et al. "Collapse of a Charge–Ordered State under Magnetic Field in Pr$_{0.5}$Sr$_{0.5}$MnO$_3$", *Phys. Rev. Lett.*, vol. 74, No. 25, Jun. 1995, pp. 5108–1111.

K. Knizek, et al. "Structure and Magnetic Properties of Pr$_{1-x}$Sr$_x$MnO$_3$ Perovskite", *Journal of Solid State Chemistry* vol. 100, 292–300 (1992).

Journal of Crystal Growth, vol. 84, No. 2, Aug. 1987, Amsterdam, NL pp. 207–211, Hashimoto et al.

Journal of Crystal Growth, vol. 60, No. 1, Nov. 1982 Amsterdam, NL pp. 191–194, Tanaka et al.

*Primary Examiner*—Mark L. Bell
*Assistant Examiner*—Louis M. Troilo
*Attorney, Agent, or Firm*—Wenderoth, Lind & Ponack

[57] ABSTRACT

Proposed is a grain boundary-free crystalline body of a perovskite structure having a chemical composition of the formula Pr$_{1-x}$M$_x$MnO$_3$, in which M is calcium or strontium and the subscript x is a number of 0.3 to 0.5, which exhibits a magnetoresistance behavior with a phase transition between an insulator phase and a ferromagnetic metallic phase accompanied by the phenomenon of hysteresis. This grain boundary-free crystalline body can be obtained by subjecting a sintered body of a powder blend consisting of the oxides of praseodymium, manganese and calcium or strontium to a crystal growing treatment by the floating zone-melting method in an atmosphere of oxygen.

6 Claims, 4 Drawing Sheets

GRAIN BOUNDARY-FREE CRYSTALLINE BODY OF MANGANESE-BASED COMPOSITE OXIDE AND METHOD FOR THE PREPARATION THEREOF

BACKGROUND OF THE INVENTION

The present invention relates to a novel grain boundary-free crystalline body of a manganese-based composite oxide and a method for the preparation thereof as well as to a switching-type magnetoresistance device by the use thereof.

Pursuant to the discovery of high-temperature superconductivity in copper oxides reported in recent years, the spin charge-coupled property of transition metal oxides has acquired renewed interests of investigators leading to the intensive investigations undertaken world-wide concerning manganese oxide-based materials having a perovskite-type crystalline structure and capable of exhibiting the phenomenon of giant magnetoresistance.

One of the manganese oxide-based materials of the perovskite structure exhibiting the negative giant magnetoresistance known heretofore is an epitaxial thin film having a chemical composition of $La_{0.67}Ca_{0.33}MnO_x$ epitaxially grown on a substrate of lanthanum aluminate $LaAlO_3$ reported in Science, volume 264 (1994), pages 414–415. However, no prior art literatures are available relating to a single crystalline body or grain boundary-free crystalline body of such a composition.

On the other hand, crystalline ceramics based on a manganese oxide having a perovskite structure are known although each of them heretofore reported is an agglomerate body consisting of a great number of minute crystals demarcated by a large number of grain boundaries. Namely, no single crystalline body of this type is also known.

SUMMARY OF THE INVENTION

The present invention accordingly has an object to provide a novel grain boundary-free crystalline body of a manganese-based composite oxide material having a perovskite structure and capable of exhibiting a switching activity and a method for the preparation of such a grain boundary-free crystalline body.

Thus, the present invention provides a grain boundary-free crystalline body of a manganese-based composite oxide of a perovskite structure having a chemical composition expressed by the general formula

$Pr_{1-x}M_xMnO_3$,  (I)

in which M is calcium or strontium and the subscript x is a positive number in the range from 0.3 to 0.5.

The above mentioned grain boundary-free crystalline body of a manganese-based composite oxide of a perovskite structure can be prepared by a method which comprises the steps of:

(a) blending powders of oxides or compounds capable of being converted to an oxide by thermal decomposition of praseodymium, manganese and calcium or strontium in such a proportion that the chemical composition of the blend corresponds to the general formula

$Pr_{1-x}M_xMnO_3$,  (I)

in which M is calcium or strontium and the subscript x is a positive number in the range from 0.3 to 0.5, to give a powder blend;

(b) sintering the powder blend in an oxidizing atmosphere to give a sintered body; and (c) subjecting the sintered body to crystal growth by the method of floating zone-melting process.

DETAILED DESCRIPTION OF THE PREFERRED EMBODIMENTS

Figure 1:
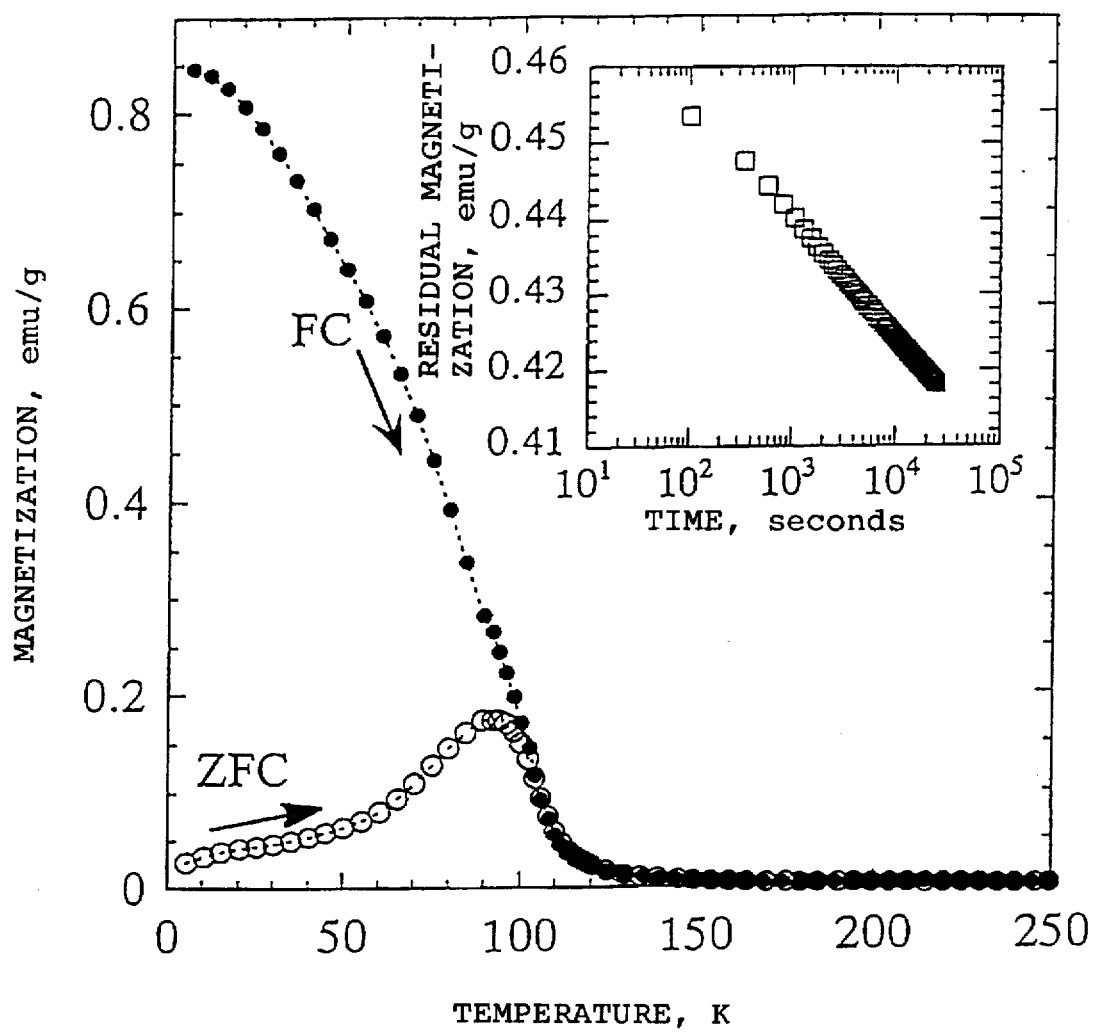
FIG. 1 is a graph showing the magnetization of the inventive crystalline body as a function of temperature.

The inventors have conducted extensive investigations with an object to develop novel materials of a manganese-based composite oxide having a perovskite structure and, as a result, have arrived at a discovery that a single crystal or a grain boundary-free crystalline body can be obtained by subjecting a sintered body consisting of the oxides of manganese, praseodymium and calcium or strontium in a specified molar proportion to crystal growing by the floating zone-melting method. Further, it has been discovered that, different from a conventional polycrystalline body or crystalline body having grain boundaries, phase transition proceeds in this grain boundary-free crystalline body from a spin-glass like insulator to a ferromagnetic metallic form when the body is under a magnetic field of 10 to 100 kOe at a temperature of 100 K. or lower leading to completion of the present invention on the base of these discoveries.

Namely, the present invention provides a grain boundary-free crystalline body of a manganese-based composite oxide of a perovskite structure having a chemical composition expressed by the general formula

$Pr_{1-x}M_xMnO_3$,  (I)

in which M is calcium or strontium and the subscript x is a positive number in the range from 0.3 to 0.5.

The above defined grain boundary-free crystalline body of a manganese-based composite oxide can be prepared by subjecting a sintered body of the composite oxide to a crystal growing process by the method of floating zone-melting.

In the above given general formula (I), M is calcium or strontium and the subscript x is a positive number in the range from 0.3 to 0.5 while the value of x should preferably be selected depending on the element M. Namely, the value of x is in the range from 0.3 to 0.4 when M is calcium and in the range from 0.4 to 0.5 when M is strontium. When the value of x is too small or too large, the desired grain boundary-free crystalline body cannot be obtained even by undertaking the floating zone-melting process.

The particular process for the preparation of the grain boundary-free crystalline body of a manganese-based composite oxide is as follows. In the first place, a powder blend is prepared by mixing powder oxides of manganese, praseodymium and calcium or strontium or powders of compounds of these elements capable of being readily converted into the respective oxide by thermal decomposition, such as carbonates, hydrogencarbonates and the like, in such a proportion that the average chemical composition of the blend is in conformity with the general formula (I) given above, if necessary, with admixture of a small amount of a binder as a sintering aid. In the next step, the powder blend is shaped by compression molding or other suitable methods known in the technology of ceramics and the thus shaped body is subjected to sintering in an oxidizing atmosphere such as atmospheric air at a temperature in the range from 1100° to 1300° C. to give a sintered ceramic body. If necessary, this ceramic body is pulverized into a powder which is again compression-molded into a shaped body having a rod-like form suitable to the floating zone-melting process. The floating zone-melting (FZ) process for this rod-formed ceramic body is performed in an oxidizing atmosphere or, preferably, in an atmosphere of oxygen at a travelling velocity of 3 to 5 mm per hour so that the ceramic body is converted into a crystalline body free from grain boundaries.

The thus obtained grain boundary-free crystalline body is a novel material which is susceptible to a magnetic field-induced phase transition from a spin glass-like state or diamagnetic state to a ferromagnetic state under a magnetic field with a great decrease in the electric resistivity from an insulating high resistivity to a low resistivity of metals. The body can be identified to be a grain boundary-free crystalline body by the X-ray back-reflection Laue method and by the neutron scattering method. The change in the electric resistivity of the inventive grain boundary-free crystalline body in a magnetic field is so great that the MR value defined by the equation:

$$MR = [R(O)/R(H)] - 1,$$

in which $R(O)$ is the resistivity in the absence of a magnetic field and $R(H)$ is the resistivity in a magnetic field, can be as large as $10^2$ to $10^{10}$ or even larger at a temperature not exceeding 100 K. in a magnetic field up to 100 kOe.

Further, the magnetization vs. magnetic field and resistivity vs. magnetic field characteristics of the inventive crystalline body exhibit a phenomenon of hysteresis in the magnetic field-scanning or an effect of memory suggesting a possibility of using the inventive crystalline body as a switching-type magnetoresistance element.

In the following, examples are given to more fully illustrate the present invention.

EXAMPLE 1

Powders of praseodymium oxide $Pr_6O_{11}$, calcium carbonate $CaCO_3$ and manganese oxide $Mn_3O_4$ were taken in such a proportion that the atomic ratio of Pr:Ca:Mn in the blend was 0.7:0.3:1 and they were thoroughly mixed together with addition of a small volume of ethyl alcohol for 30 minutes by using a mortar and pestle of agate. The powder blend was calcined at 1200° C. for 24 hours in atmospheric air and the calcined powder blend was disintegrated into a fine powder which was then compression-molded in a hydraulic press under a pressure of 2 tons/cm² to give a rod-formed shaped body having a diameter of about 5 mm and a length of about 80 mm.

The rod-formed shaped body was subjected to a floating zone-melting process for crystal growing in a floating zone-melting furnace equipped with two incandescent halogen lamps and semi-elliptic focusing mirrors in an atmosphere of pure oxygen gas at a travelling velocity of 3 to 5 mm per hour. The rod as the starting material and the seed crystal rod were rotated in the reverse directions relative each to the other at a relative velocity of 30 rpm.

A small portion taken from the central part of the thus obtained rod was pulverized into a powder which was analyzed by the powder X-ray diffractometry to find a single phase without any impurity phases. The crystal form of this crystalline rod was orthorhombic with lattice constants of $a_0 = 0.544$ nm, $b_0 = 0.548$ nm and $c_0 = 0.768$ nm. The content of calcium therein was in good consistency with the value calculated from the formulation of the starting oxide or carbonate powders. According to the results of the analysis by an electron-beam microprobe analyzer, the homogeneity of the content of calcium throughout the rod was excellent with a standard deviation of ±0.005 in the value of x in the general formula (I) from the target value of 0.3.

Characterization Test 1.

The crystalline body prepared in Example 1 was subjected to the measurement of the magnetization at varied temperatures below 250 K. under the conditions of ZFC, i.e. zero-field cooling, in the absence of any magnetic field and FC, i.e. field cooling, with application of a magnetic field of 5 Oe. The results are shown in FIG. 1 as a function of temperature. FIG. 1 also includes an inset graph (upper right) showing relaxation of the residual magnetization at 70 K. as a function of time in seconds. The magnetization vs. temperature curves of FIG. 1 indicate that a transition took place in the crystalline body at about 110 K. from a paramagnetic phase to a ferromagnetic phase.

When the temperature was further decreased from 110 K., the FC magnetization increased monotonously as the temperature was decreased while the ZFC magnetization curve had a maximum point at about 85 K. and the magnetization decreased thereafter. The transition at about 110 K. indicated by the ZFC and FC curves in FIG. 1 was rather broadened as compared with ordinary transitions from paramagnetic to ferromagnetic. Further the phenomenon of relaxation was noted in the residual magnetization as is shown in the inset graph of FIG. 1. The data shown in this inset graph was obtained by switching off the magnetic field of 5 Oe after setting the temperature at 70 K. in the FC run to measure the residual magnetization as a function of the time after switching off of the magnetic field by keeping the temperature at 70 K.

Characterization Test 2.

Figure 2:
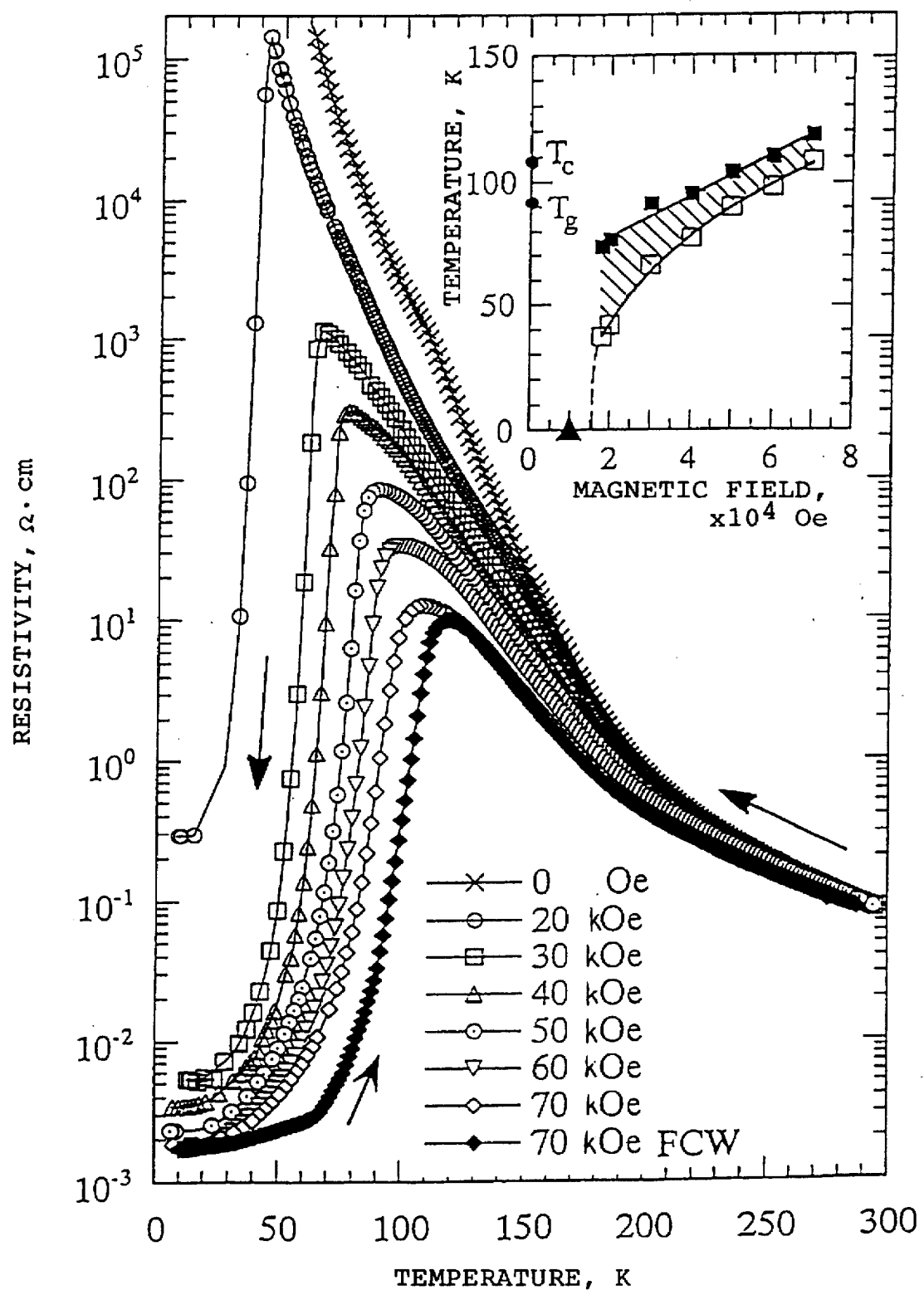
FIG. 2 is a graph showing the resistivity of the inventive crystalline body under varied magnetic fields as a function of temperature.

The crystalline rod prepared in Example 1 was subjected to the measurement of the electric resistivity by the four-probe method at temperatures decreased from 300 K. down to 4.2 K. under the conditions of FC, i.e. field cooling, in a magnetic field varied up to 70 kOe. The results are shown in FIG. 2 as a function of the decreasing temperature for the respective values of the magnetic field including zero field plotted with the cross marks. The measurement in a magnetic field of 70 kOe was followed by additional measurements under the conditions of FCW, i.e. field-cooled warming, in which the temperature was increased from 4.2 K. up to 300 K. to give the curve plotted with the filled diamond marks. In the measurements, the magnetic field was applied parallel to the longer side of a reactangular plate-formed sample, which was also the direction of the electric current in the four-probe method. The inset in FIG. 2 is a phase diagram showing the insulator phase and the metallic phase relative to the magnetic field (abscissa) and temperature (ordinate).

As is shown in FIG. 2, the transition between the insulator phase and the metallic phase takes place in a magnetic field of 20 kOe or higher. In an experiment under a magnetic field of 70 kOe, hysteresis was noted between the FC and FCW processes as is exemplified by the data obtained under a magnetic field of 70 kOe. For example, the transition under a magnetic field of 30 kOe from the insulator phase to the metallic phase takes place at 90 K. in the FC process while the transition from metallic form to insulator in the FCW process takes place at 103 K. The insulator-to-metallic transition temperature increases with increase in the magnetic field accompanied by an anomalous behavior, i.e. appearance of the metallic phase from the low-temperature side with increase in the magnetic field.

Characterization Test 3.

Figure 3A:
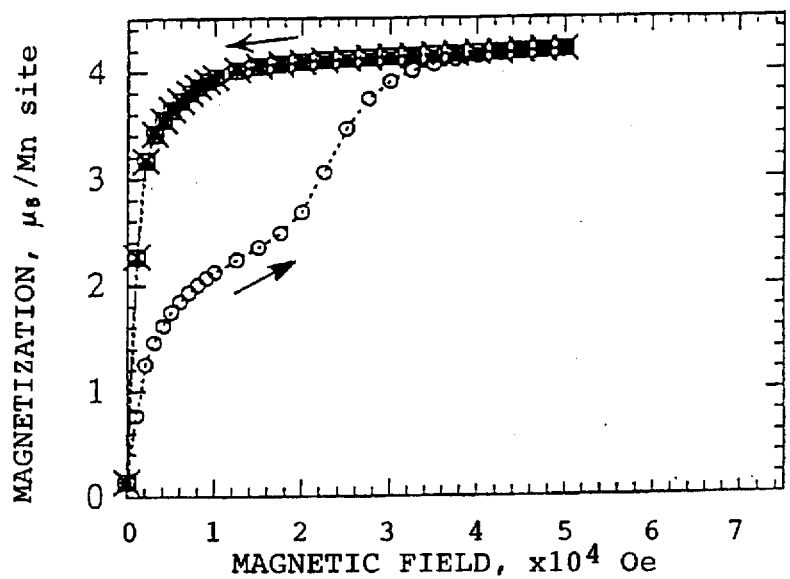
FIG. 3a is a graph showing the magnetization of the inventive crystalline body as a function of magnetic field at 12.6 K.
Figure 3B:
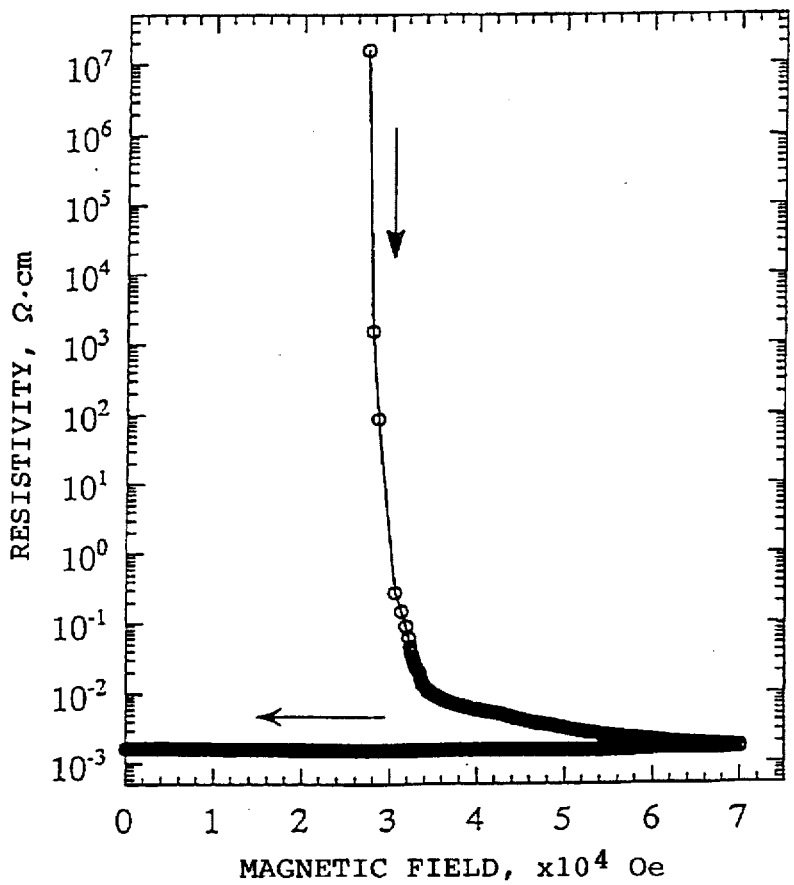
FIG. 3b is a graph showing the resistivity of the inventive crystalline body as a function of magnetic field at 12.6 K.

With an object to investigate the mechanism of the transition between the insulator and metallic phases, measurements were performed at 12.6 K. for the magnetization vs. magnetic field relationship and for the resistivity vs. magnetic field relationship to give the results shown in FIGS. 3a and 3b, respectively, obtained in the experiments in which the crystalline body prepared in Example 1 was first cooled down to 12.6 K. in the absence of magnetic field and, while keeping this temperature, the magnetic field was increased up to 70 kOe and then decreased to zero to measure the magnetization and resistivity as a function of magnetic field. This procedure with increasing and decreasing magnetic fields was repeated twice. In FIG. 3a, the lower curve shows the results obtained by the measurement of the magnetization under an increasing magnetic field for the virgin sample and the upper curve shows the results obtained in the measurement under a decreasing magnetic field in the first run as well as the results obtained in the second run measurements under both increasing and decreasing magnetic fields.

In FIG. 3a, namely, the first magnetization curve has an inflexion point at about 20 to 30 kOe to exhibit the transition from canted antiferromagnetic to ferromagnetic state. The reason why the saturated magnetization is even larger than the classical value of 3.85 $\mu_B$/Mn site may be due to the contribution of $Pr^{3+}$ whose static moments are induced at 40 K. or below by the effective exchange field of Mn ions. In the first run measurements, the magnetization under an increasing magnetic field switches to the ferromagnetic branch under a magnetic field larger than 30 kOe to follow the ferromagnetic branch thereafter and then follows the ferromagnetic branch in the decreasing-field measurements. In the second run measurements, the increasing-field magnetization no longer follows the virgin curve obtained in the first run but traces the ferromagnetic branch in the first run which is followed also in the decreasing-field measurements in the second run.

The resistivity, which is $10^7$ ohm.cm or higher under zero field, rapidly decreases when the magnetic field is increased to exceed 30 kOe and reaches $1.7 \times 10^{-3}$ ohm.cm under 70 kOe. In the subsequent measurements under a decreasing magnetic field down to zero, the resistivity remains constant at the value under 70 kOe. This low resistivity is kept throughout the second run measurements under increasing and decreasing magnetic fields.

Characterization Test 4.

Figure 4:
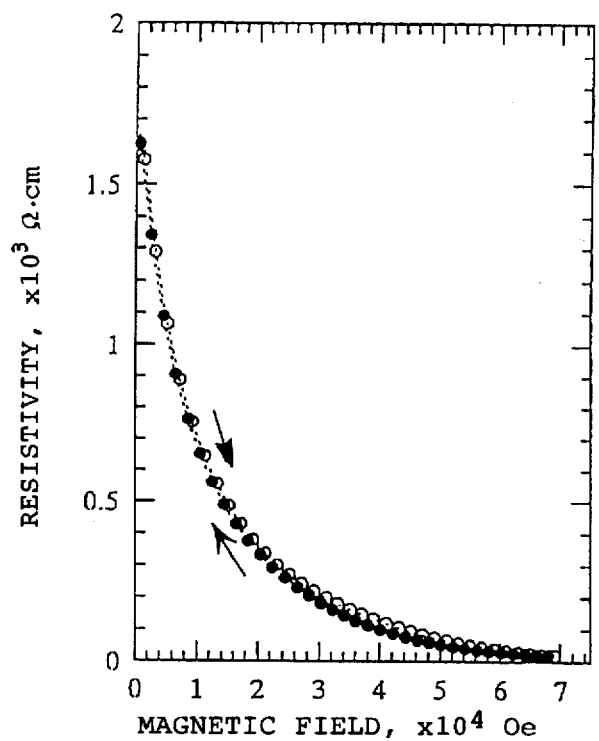
FIG. 4 is a graph showing the resistivity of the inventive crystalline body as a function of magnetic field at 103.6 K.
Figure 5:
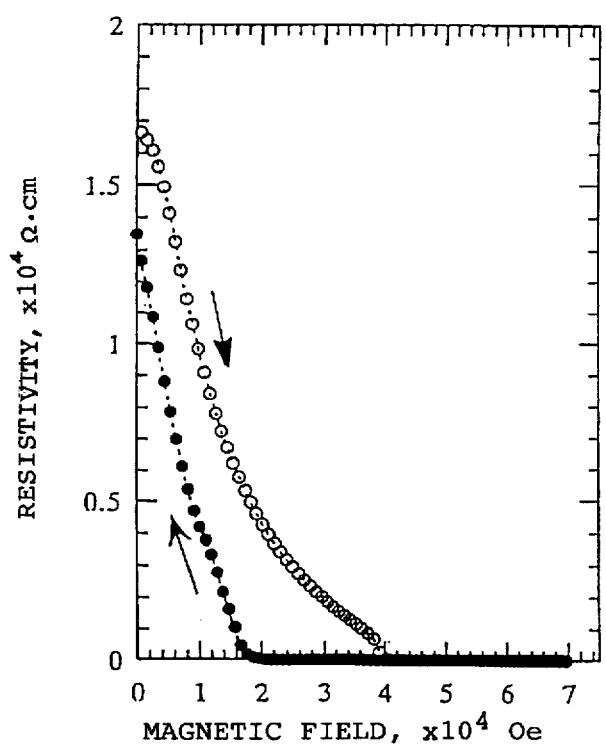
FIG. 5 is a graph showing the resistivity of the inventive crystalline body as a function of magnetic field at 67.2 K.

Measurements were performed with the crystalline body prepared in Example 1 for the resistivity vs. magnetic field relationship at 103.6 K. and 67.2 K. to give the results shown in FIGS. 4 and 5, respectively. At 103.6 K., as is shown in FIG. 4, the resistivity is decreased monotonously as the magnetic field is increased in both of the increasing-field and decreasing-field-measurements following the same curve with almost no hysteresis. At 67.2 K., on the other hand, as is shown in FIG. 5, the decrease in the resistivity in the increasing-field measurements starts already under a very low magnetic field reaching to the low resistivity of the metallic phase at about 40 kOe while, in the decreasing-field measurements, increase in the resistivity begins only at about 20 kOe following another resistivity vs. field curve to exhibit hysteresis.

The above described results obtained in the Characterization Tests support the conclusion that the grain boundary-free crystalline body of the invention having a chemical composition of $Pr_{0.7}Ca_{0.3}MnO_3$ is susceptible to a magnetic field-induced phase transition to act as a switching-type magnetoresistance element.

EXAMPLE 2

Praseodymium oxide, strontium carbonate and manganese oxide were blended in such a proportion that the atomic ratio of Pr:Sr:Mn was 0.6:0.4:1 and the powder blend was thoroughly milled by using a mortar and pestle of agate for 30 minutes with addition of a small volume of ethyl alcohol. The thus obtained powder blend was calcined in air at 1200° C. for 24 hours followed by disintegration into a fine powder.

A rod-formed body having a diameter of about 5 mm and a length of about 80 mm was prepared from the powder by compression molding in a hydraulic press under a pressure of 2 tons/cm² and the rod was sintered in air at 1200° C. for 12 hours.

The thus obtained sintered rod was subjected to the floating zone-melting process in the same manner as in Example 1 into a grain boundary-free crystalline body which had a perovskite structure and a chemical composition expressed by the formula $Pr_{0.6}Sr_{0.4}MnO_8$. This crystalline body was identified to be a single crystal by the X-ray back-reflection Laue method and neutron scattering method.

What is claimed is:

1. A grain boundary-free crystalline body of a manganese-containing composite oxide of a perovskite structure having a chemical composition expressed by the general formula $$Pr_{1-x}M_xMnO_3,$$

in which M is calcium or strontium and the subscript x is a number in the range from 0.3 to 0.5.

2. The grain boundary-free crystalline body of a manganese-containing composite oxide as claimed in claim 1 in which M is calcium and the subscript x is a number in the range from 0.3 to 0.4.

3. The grain boundary-free crystalline body of a manganese-containing composite oxide as claimed in claim 1 in which M is strontium and the subscript x is s number in the range from 0.4 to 0.5.

4. A method for the preparation of a grain boundary-free ystalline body of a manganese-containing composite oxide of a perovskite structure having a chemical composition expressed by the general formula $$Pr_{1-x}M_xMnO_3,$$

in which M is calcium or strontium and the subscript x is a number in the range from 0.3 to 0.5, which comprises the steps of:

(a) blending powders of oxides of praseodymium, manganese and calcium or strontium or compounds of praseodymium, manganese and calcium or strontium capable of being converted to an oxide by thermal decomposition in such a proportion that the chemical composition of the blend corresponds to the formula $$Pr_{1-x}M_xMnO_3,$$

in which each symbol has the same meaning as defined above, to give a powder blend;

(b) shaping and sintering the powder blend in an oxidizing atmosphere to give a sintered body; and (c) subjecting the sintered body to crystal growth by the method of floating zone-melting process in an oxidizing atmosphere.

5. The method for the preparation of a grain boundary-free crystalline body of a manganese-containing composite oxide as claimed in claim 4 in which the temperature in step (b) for sintering of the powder blend is in the range from 1100° to 1300° C.

6. The method for the preparation of a grain boundary-free crystalline body of a manganese-containing composite oxide as claimed in claim 4 in which the oxidizing atmosphere in step (c) is an atmosphere of oxygen gas.

* * * * *